United States Patent [19]
Solheim

[11] Patent Number: 5,443,994
[45] Date of Patent: Aug. 22, 1995

[54] METHOD OF FABRICATING A SEMICONDUCTOR DEVICE HAVING A BOROSILICATE GLASS SPACER

[75] Inventor: Alan G. Solheim, Puyallup

[73] Assignee: National Semiconductor Corporation, Santa Clara, Calif.

[21] Appl. No.: 311,837

[22] Filed: Sep. 23, 1994

Related U.S. Application Data

[63] Continuation of Ser. No. 73,645, Jun. 8, 1993, abandoned, which is a continuation of Ser. No. 774,123, Oct. 10, 1991, abandoned, which is a continuation of Ser. No. 503,346, Apr. 2, 1990, abandoned.

[51] Int. Cl.$^6$ ............................................. H01L 21/225
[52] U.S. Cl. .................................... 437/164; 437/31; 437/59; 437/162
[58] Field of Search ............... 437/162, 163, 164, 158, 437/31, 41, 59

[56] References Cited

U.S. PATENT DOCUMENTS

| | | | |
|---|---|---|---|
| 3,955,269 | 5/1976 | Magdo et al. | 357/43 |
| 4,484,388 | 11/1984 | Iwasaki | 156/657 |
| 4,507,847 | 4/1985 | Sullivan | 148/1.5 |
| 4,536,945 | 8/1985 | Gray et al. | 148/175 |
| 4,609,568 | 9/1986 | Koh et al. | 148/DIG. 19 |
| 4,737,472 | 4/1988 | Schaber et al. | 148/DIG. 9 |
| 4,764,480 | 8/1988 | Vora | 437/54 |
| 4,795,722 | 1/1989 | Welch et al. | 437/192 |
| 4,829,025 | 5/1989 | Iranmanesh | 437/228 |
| 4,897,364 | 1/1990 | Nguyen | 437/69 |
| 5,006,476 | 4/1991 | De Jong et al. | 437/31 |

FOREIGN PATENT DOCUMENTS

| | | | |
|---|---|---|---|
| 0010633 | 5/1980 | European Pat. Off. | |
| 0290761 | 12/1986 | Japan | 437/41 |
| 0060220 | 3/1987 | Japan | 437/164 |
| 0210677 | 9/1987 | Japan | 437/164 |

OTHER PUBLICATIONS

Brown, et al., *Journal of Crystal Growth*, vol. 17, pp. 276–287, 1972.
Takemura et al., "BSA Technology for Sub-100 nm Deep Base Bipolar Transistors", NEC Research & Development, No. 9, Jul. 1988 pp. 10–13.
Brassington, et al., "An Advanced Single-Level Polysilicon Submicrometer BiCMOS Technology," IEEE Trans. Elect. Devices.
Momose, et al., "1 μm n-well CMOS/Bipolar Technology," IEDM Transactions (Feb. 1985) p. 217.
Kapoor, et al., "A High Speed High Density Single-Poly ECL Technology for Linear/Digital Applications" 1985 Custom Integrated Circuits Conference.
Gomi, et al., "A Sub-30 psec Si Bipolar LSI Technology" IEDM Technical Digest (1988) pp. 744–747.
Takemura, et al., "BSA Technology for Sub-100 mn Deep Base Bipolar Transistors" IEDM Technical Digest (1987), pp. 375–377.
Chiu, et al., "A Bird's Beak Free Local Oxidation Technology Feasible to VSLI Circuits Fabrication" IEEE Transactions on Electron Devices, vol. ED-29, No. 4, pp. 536–540, Apr. 1982.

Primary Examiner—Brian E. Hearn
Assistant Examiner—Tuan Nguyen
Attorney, Agent, or Firm—Townsend and Townsend Khourie and Crew

[57] ABSTRACT

A bipolar transistor and a PMOS device achieves improved performance through the use of borosilicate glass (BSG) as the sidewall spacer material. The sidewall spacer material also is used for injection of boron into adjacent substrate material for forming shallow p+ doped junctions. By using diffusion from the BSG to form and/or maintain (during subsequent processing) a bipolar base region, or a PMOS source and/or drain region, rather than ion implantation, a base region is formed which is both shallow and has a low sheet resistance.

6 Claims, 13 Drawing Sheets

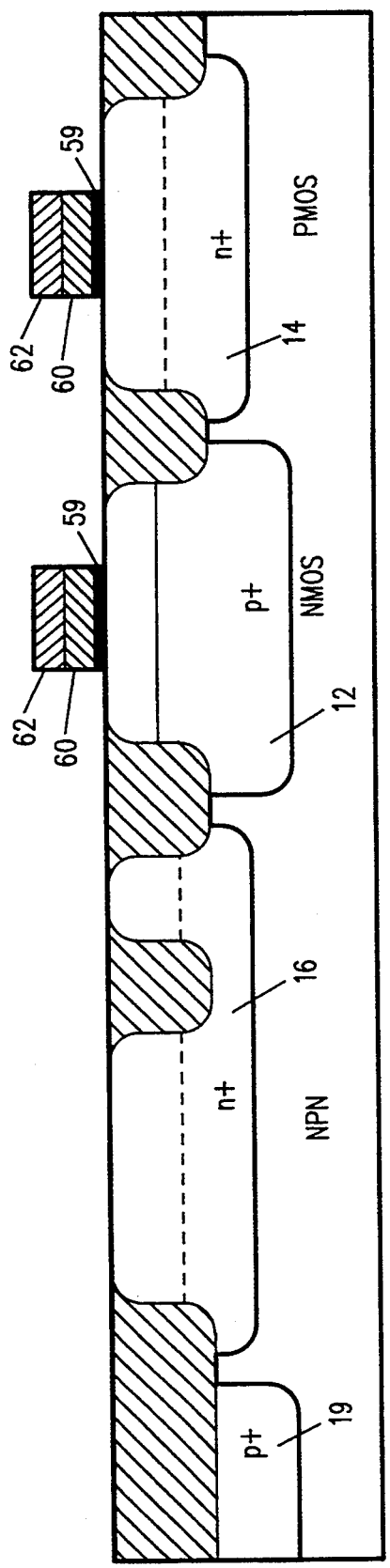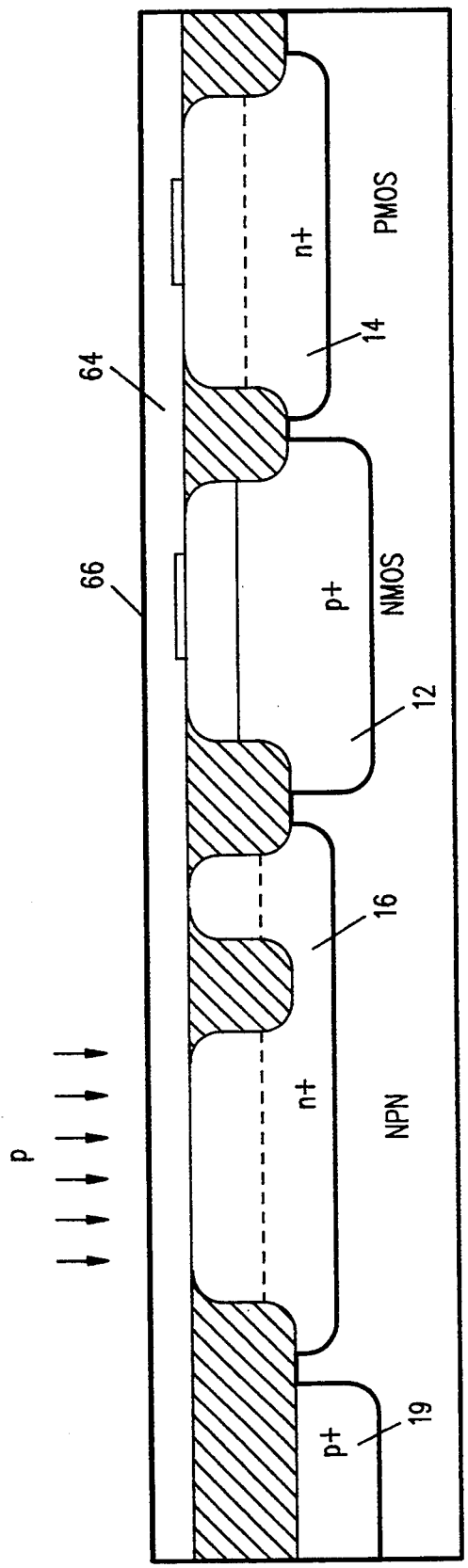

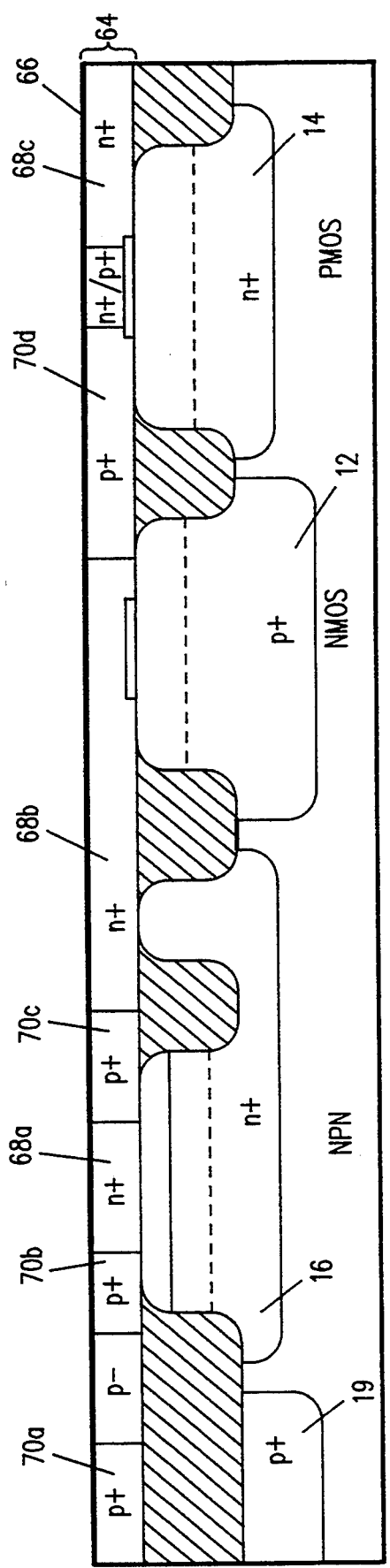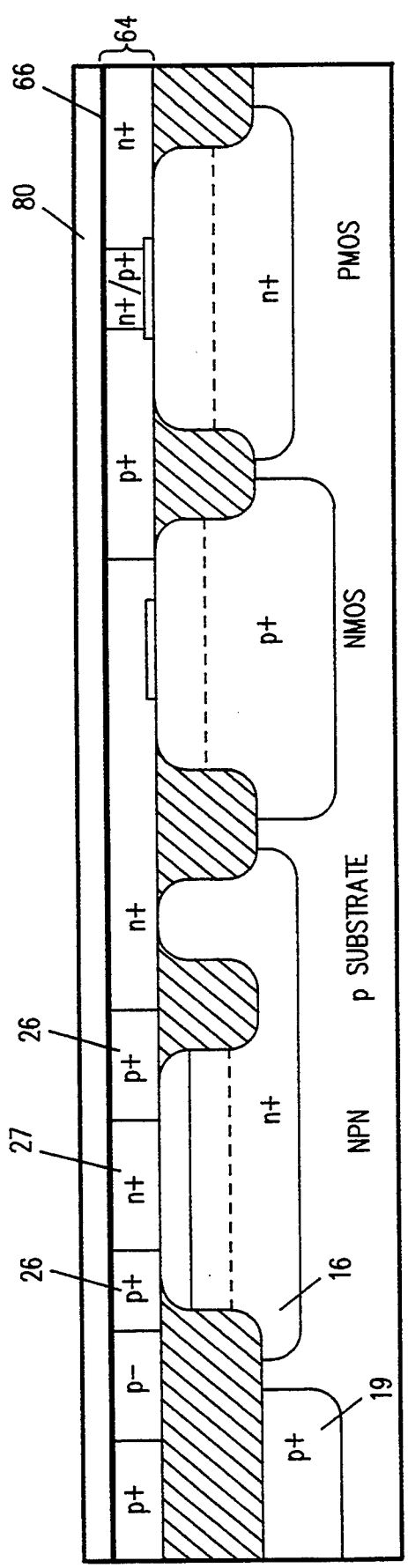
FIG. 2e
FIG. 2f

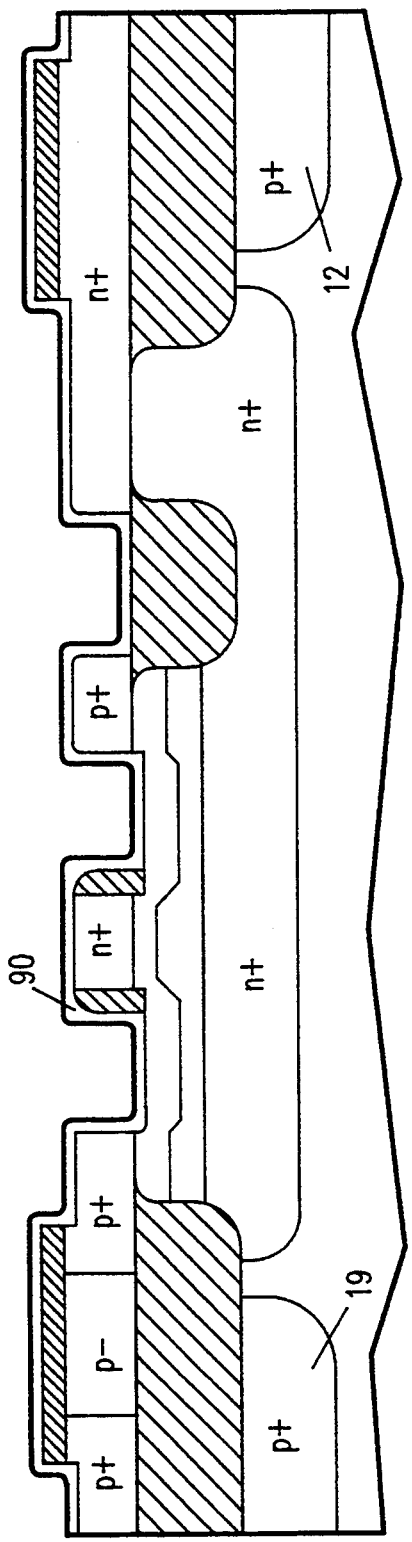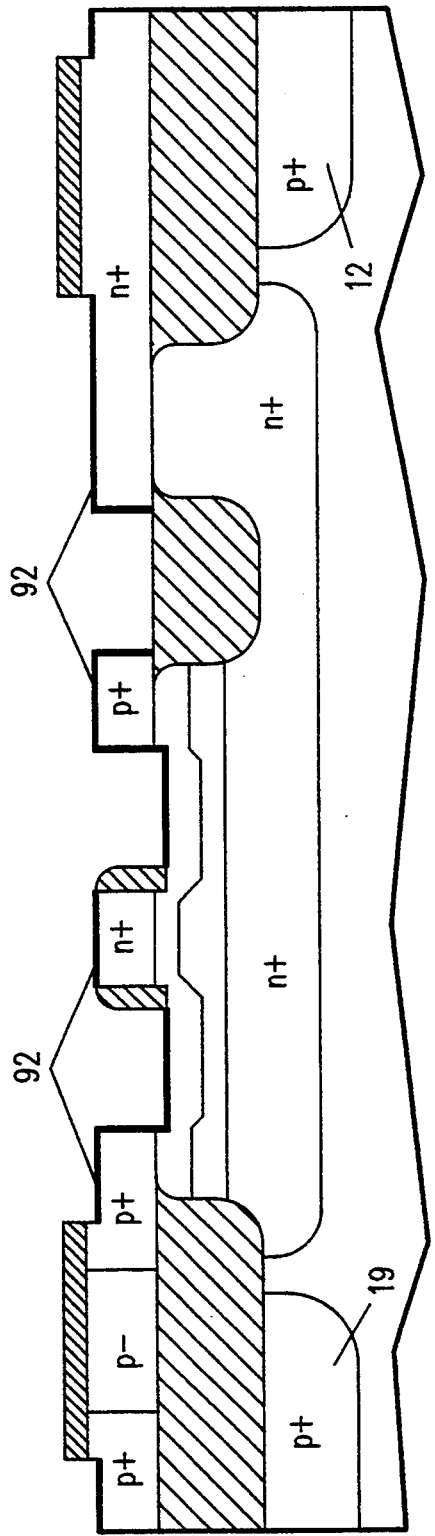

METHOD OF FABRICATING A SEMICONDUCTOR DEVICE HAVING A BOROSILICATE GLASS SPACER

This is a continuation of application Ser. No. 08/073,645, filed Jun. 8, 1993, now abandoned which is a continuation of application Ser. No. 07/774,123, filed Oct. 10, 1991, now abandoned, which is a continuation of application Ser. No. 07/503,346, filed Apr. 2, 1990, now abandoned.

BACKGROUND OF THE INVENTION

The present invention relates to the field of semiconductor devices and their manufacture. More specifically, in one embodiment the invention provides single polysilicon bipolar transistors, or p-channel metal-oxide semiconductors (PMOS) devices with borosilicate glass (BSG) sidewall spacers.

PMOS devices are often formed on a substrate along with n-channel metal-oxide semiconductors (NMOS) to produce complementary metal oxide semiconductors (CMOS). Bipolar and CMOS devices and their fabrication have been well known for many years. Recently, the advantages of both types of devices have been beneficially incorporated into circuits using both types of devices on a single substrate. Circuits which incorporate both bipolar and CMOS devices have come to be known as "BiCMOS." BiCMOS devices offer the advantages of the high packing density and low power consumption of CMOS devices, as well as the high speed of bipolar devices. One BiCMOS device and process for fabrication thereof is described in U.S. Pat. No. 4,764,480 (Vora), assigned to the assignee of the present invention.

While meeting with some success, BiCMOS devices continue to have certain limitations. Electrical contacts in BiCMOS circuits have caused limitations in their performance. For example, the current drive capability of CMOS devices is typically limited by source/drain sheet resistance. Extrinsic base resistance in bipolar transistors is in some instances an important factor in AC performance of bipolar structures. Still further, collector-substrate junction capacitance degrades the speed of bipolar circuits. High resistivity of a polysilicon-silicon substrate contact can limit the performance of especially small devices (e.g., submicron).

An improved BiCMOS device and method of fabrication thereof is desired not only to provide devices with improved performance and reduced size, but also to provide devices which can be fabricated simply and economically.

SUMMARY OF THE INVENTION

The present invention includes the recognition of certain problems found in previous devices. Some fabrication techniques for these devices, notably single polysilicon fabrication processes, employ a spacer layer on the sidewalls of the bipolar device base contact and/or the PMOS gate region. Previous fabrication techniques have used a thermally grown or deposited undoped oxide to form the spacer. This requires an implant to provide the required doping levels under the oxide. Using previous techniques, it was difficult to fabricate shallow, highly doped regions under the spacers.

According to the present invention, a transistor device, which can be either a bipolar transistor or a field effect transistor, is formed using regions of polysilicon deposited on a substrate. The sidewalls of the polysilicon regions are provided with a spacer material. In the present invention, the spacer material for at least some sidewall spacers is made of a borosilicate glass (BSG). The sidewall spacer material also is used for an injection of boron into adjacent substrate material for forming shallow p+ doped junctions.

For bipolar devices, the spacers are used to separate the emitter polysilicon contact from a silicided extrinsic base region. It has been found that, when the extrinsic base is formed by ion implantation, the surface concentration is undesirably lowered due to segregation of boron into the oxide during subsequent thermal cycles. These lower concentrations result in reduction of the electric field which serves to confine the electron current injected by the emitter. Furthermore, as the spacer is reduced, a larger percent of the injected current recombines at the silicided extrinsic base region, causing a reduction in current gain.

In order to prevent channeling, the extrinsic base implant must be performed at least seven degrees off axis. Such off-axis implantation causes a shadow effect because of the shadow cast by an emitter contact positioned over the extrinsic base region. With submicron geometries, the shadowing effect of the emitter polysilicon may cause a poor link-up between the intrinsic and extrinsic base regions. This is made even more severe if the resist used to pattern the polysilicon is left in place to serve as an implant mask against the extrinsic base implant.

The extrinsic base region in a single polysilicon bipolar process must have a low sheet resistance in order to minimize the base resistance and must have a shallow junction to minimize a base-to-collector capacitance. When using ion-implantation, especially boron implantation, it is difficult to meet these two requirements simultaneously.

PMOS devices also require a shallow, highly doped source and drain region to maximize performance. These requirements place severe restraints on the implantation and thermal budget when boron implantation is used.

In summary, previous devices which used an oxide sidewall and relied solely on ion-implantation typically suffered reduced current gain, poor link up between intrinsic and extrinsic base regions and difficulty in meeting sheet resistance and shallow junction requirements in bipolar devices and difficulty in producing shallow, highly doped source and drain regions in PMOS devices.

The present invention although not limited to a specific application, is particularly useful in connection with single polysilicon bipolar transistors with a self-aligned extrinsic base region and a self-aligned silicide process. The process also can be applied to PMOS device fabrication.

An improved BiCMOS technology incorporating both the improved bipolar device and the improved PMOS device and method of fabrication thereof is disclosed. The invention provides devices which have improved performance, reduced size, and/or which may be fabricated more simply and economically. The devices disclosed herein may be used with, for example, high performance Emitter Coupled Logic (ECL) standard cell designs, memory cells, gate array designs with embedded memory, and the like.

In one embodiment, the invention comprises first forming a buried layer by doping portions of a substrate and, later, depositing polysilicon on the surface of the substrate in the area of the buried layer. A cap oxide layer is formed on the polysilicon and portions of the polysilicon are implanted to form a base region adjacent a portion of the buried layer. Other portions of the polysilicon are implanted to form an emitter contact. A layer of nitride is formed over the cap oxide layer and portions of the polysilicon. The cap oxide and nitride layers are etched to separate the base portion from the emitter contact, thus producing a sidewall on the emitter contact. A layer of borosilicate glass is deposited. The substrate is heated to cause diffusion from the borosilicate glass into adjacent portions of the substrate, forming a p+ junction. Preferably, the substrate is masked and etched to produce borosilicate glass spacers on the sidewalls.

In another embodiment of the invention, portions of a substrate are doped to form a buried layer and polysilicon is deposited on the surface of the substrate. A cap oxide layer is formed on the polysilicon and portions of the polysilicon are implanted to form a gate region adjacent a portion of the buried layer. Other portions of the polysilicon are implanted to form a well tap. A layer of nitride is formed over the cap oxide layer. Portions of the polysilicon, cap oxide and nitride layer are etched to separate the gate region from the well tap, thus producing a sidewall on the gate region. A layer of borosilicate glass is deposited and the substrate is heated to cause diffusion from the borosilicate glass to adjacent portions of the substrate. Preferably, the substrate is etched to produce borosilicate glass spacers on the sidewalls.

A further understanding of the nature and advantages of the inventions herein may be realized by reference to the remaining portions of the specification and the attached drawings.

DESCRIPTION OF THE PREFERRED EMBODIMENTS

CONTENTS

General

II. Fabrication Sequence of BiCMOS Devices

III. Device Performance

I. General

Figure 1:
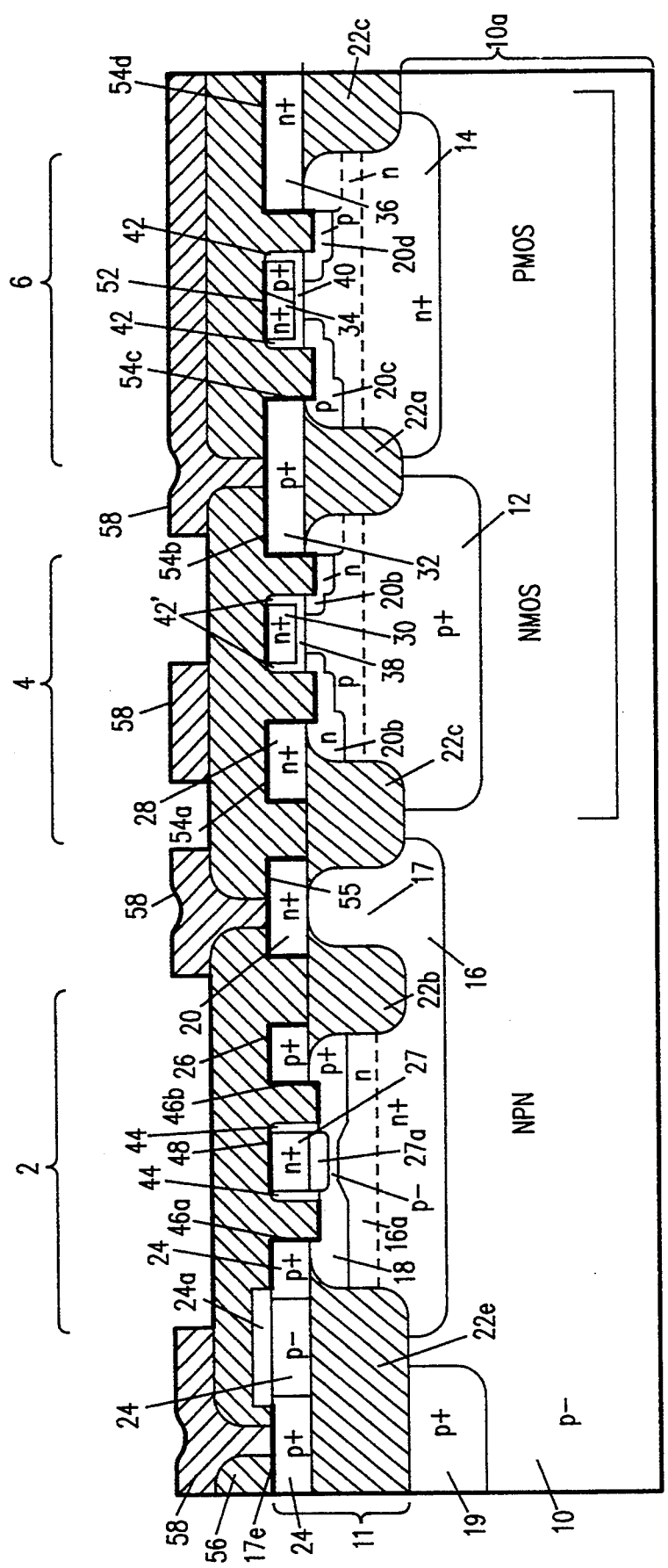
FIG. 1 is a cross-section of a BiCMOS structure according to one embodiment of the invention.

FIG. 1 illustrates a BiCMOS device in cross-section which includes a bipolar transistor and a PMOS device formed according to one embodiment of the invention. The device includes a bipolar transistor 2 (which in the embodiment shown in FIG. 1 is an NPN transistor), an n-channel MOSFET (NMOS transistor) 4 and a p-channel MOSFET (PMOS transistor) 6 in the same substrate 10. Preferably, the substrate 10 includes a single-crystal body 10a and an epitaxial layer 11. The NMOS transistor 4 and the PMOS transistor 6 are appropriately connected to form a CMOS structure 8. The devices are fabricated on a substrate 10. In the embodiment shown in FIG. 1 the substrate is a p-substrate having a dopant concentration of between about $1\times10^{13}$ and $1\times10^{16}$ with a preferred range of $2\times10^{14}$ and $3\times10^{15}/cm^3$. Using a well-known technique, a reduced pressure n-type epitaxial silicon layer 11 of desired thickness is grown on top of the single-crystal body and the devices are fabricated in the epitaxial layer.

In most embodiments the NMOS transistor 4 is formed in a p+ tub or p well 12 and the PMOS transistor 6 is formed in an n+ tub or n well 14. In preferred embodiments the n well 14 is graded and doped to a concentration of between about $3\times10^{16}$ and $2\times10^{19}/cm^3$ with a preferred concentration of between about 2 and $5\times10^{16}/cm^3$. The p well 12 is graded and doped to a concentration of between about $1\times10^{16}$ to $1\times10^{18}$ with a preferred range of about $1\times10^{17}$ to $7\times10^{17}/cm^3$, although a wide range of dopant concentrations may be used without departing from the scope of the invention. Wells 12 and 14 enable the complementary conductivity devices to be formed on a single substrate.

The NPN transistor 2 is provided with a heavily doped buried layer 16 and collector sink 17, which together provide a low resistance connection region between a collector contact 20 and the collector 16a beneath a p-type base 18. In preferred embodiments the buried layer 16 and sink 17 are doped to a concentration of between about $1\times10^{17}$ and $1\times10^{20}$ with a preferred range of about $5\times10^{18}$ to $1\times10^{20}/cm^3$. The collector 16a is a lightly doped n-type collector formed between the base region 18 and the buried layer 16. An emitter region 27a is diffused into the epitaxial layer underlying the emitter contact 27.

Formation of the NMOS and PMOS devices includes a doping of selected portions of the substrate. Regions 20a, 20b in the NMOS device 4, are n-doped to provide source and drain regions. In the PMOS device 6 regions 20c, 20d are p-doped to provide source and drain regions.

A well-known p+ channel stop 19 is provided between the NPN transistor and adjacent devices to prevent short circuit inversion of the lightly doped substrate which would connect the buried layer 16 with adjacent devices. Between the NMOS transistor 4 and the PMOS transistor 6, between the sink 17 and the base 18, between the NPN and NMOS transistor, and between the transistors shown in FIG. 1 and adjacent transistors, oxide isolation regions 22a, 22b, 22c, 22d, and 22e respectively, are provided which typically will be, for example, $SiO_2$ for device isolation. Viewed from the top of the structure, these oxide isolation regions connect to each other to form annular bands around the active device areas.

Along the surface of the device and formed from a single layer of deposited polycrystalline silicon (polysilicon), are a resistor 24, p+ base contact 26, 26', a portion of which 26, also functions as an end contact for the resistor 24, emitter contact 27, n+ collector contact 20, NMOS source contact 28, NMOS gate 30, NMOS/PMOS drain contact 32, PMOS gate 34, and PMOS source contact 36. Thin gate oxide layers 38, 40 are provided beneath the NMOS and PMOS transistor gates, and sidewall spacers 42', 42, are provided on the sides of the NMOS and PMOS gates. Preferably at least the PMOS gate sidewall spacers 42 are formed of borosilicate glass. BSG sidewall spacers 44 are also provided on the sidewalls of the bipolar emitter 27.

In preferred embodiments the NMOS gate 30 is formed of heavily doped n+ polysilicon, while the PMOS gate 34 may be formed from n+ or p+ polysilicon. N is preferred in the PMOS gate 34 because n+ will provide a buried channel device while p+ will provide a surface channel device.

Refractory metal silicide contacts 46a, 46b are formed on the p+ bipolar transistor base contacts 26, 26'. The silicide contact covers the upper portion of the base contact, the sidewalls of the base contact, as well as the surface of the base region 18 from the sidewall of the base contact up to the sidewall spacer 44 of the emitter 27. A separate silicide contact 48 is provided along the top portion of the emitter 27 between the sidewall spacer regions 44. The refractory metal contacts shown herein reduce the resistivity of the base contact and, therefore, increase the speed of the device. Silicide 54e overlies the far end contact of the resistor 24. A layer of oxide 24a is positioned over the central portion of the resistor 24 to prevent the formation of silicide in that region which would otherwise lower the resistance of the resistor 24.

Similarly, silicide contacts are provided for collector contact 20, NMOS source contact 28, NMOS gate 30, NMOS/PMOS drain contact 32, PMOS gate 34, and PMOS drain contact 36. Like the contact for the emitter 27, the silicide contacts 50 and 52 for the NMOS and PMOS gates, respectively, extend only from sidewall spacer to sidewall spacer 42, 42'. Conversely, the silicide contacts 54a, 54b, 54c, and 54d for the NMOS and PMOS transistors also cover the sidewall of the polysilicon contacts and extend along the horizontal portion of the source/drain up to the sidewall oxide 42', 42 of the gates 30 and 34. The silicide 55 for the collector contact 20 covers the sidewalls of the contact down to field oxide regions 22b and 22c, as well as the upper surface of the collector contact 20. The structure further includes a thick (0.8 to 1.3 and preferably about 1.0 μm) oxide layer 56 to insulate the devices from metal layer 58, used for interconnection purposes.

II. Fabrication Sequence of BiCMOS Devices

Figure 2A:
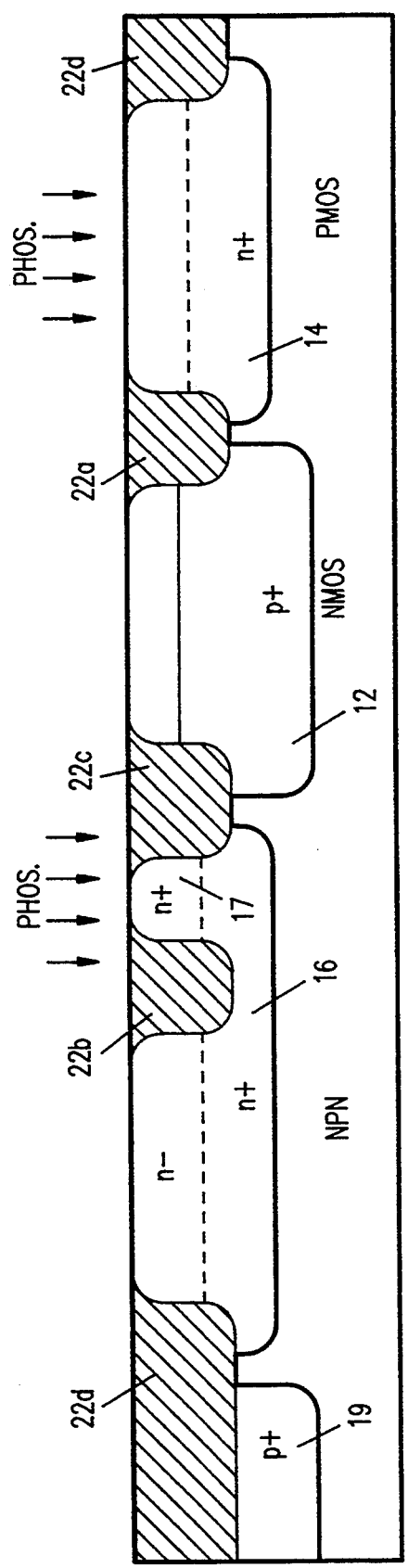
FIGS. 2a to 2n illustrate fabrication of the bipolar portion of a BiCMOS device.

FIGS. 2a through 2n illustrate fabrication of the bipolar transistor portion of the BiCMOS devices shown in FIG. 1. In particular, FIG. 2 illustrates a cross-section of the devices at a first stage of their fabrication. To reach this stage, the single-crystal body 10a was masked for simultaneous formation of the n+ well 14 and the NPN buried layer 16 with arsenic, antimony, or the like. The implant energy used for formation of regions 14 and 16 is preferably about 100 to 200 keV with a preferred range of between about 70 to 80 keV such that the dopant concentration of regions 14 and 16 is between about $5 \times 10^{17}$ to $2 \times 10^{20}$ atoms per cubic centimeter with a preferred range of about $1 \times 10^{19}$ and $1 \times 10^{20}/cm^3$.

After formation of the n+ regions 14 and 16, the device is then masked for simultaneous formation of the p+ channel stop 19 and the NMOS well 12. The implant energy used in formation of the regions 19 and 12 is preferably between about 100 to 200 keV with a preferred range of 50 to 150 keV such that the dopant concentration of the p+ buried layers is between about $1 \times 10^{17}$ and $1 \times 10^{18}/cm^3$. The p+ regions preferably are doped with boron.

The buried layer/channel stop mask is then removed and a doped n-type epitaxial silicon layer 11 having a thickness of about 1.1 μm is grown across the surface of the single crystal body 10a. After depositing sandwiched layers of oxide and nitride, a photoresist mask is then formed over the surface so as to define oxide regions 22a, 22b, 22c, and 22d. The oxide regions are formed using a modified sidewall masked isolation ("SWAMI") process. The SWAMI process is described, e.g., in Chin, et al., *IEEE Transactions on Electron Devices*, Vol. ED-29, No. 4, April 1982, pp. 536–540. In some embodiments, the process is modified as described in application Serial No. 07/502,943 (attorney docket number 8332-237), incorporated herein by reference. The substrate is then oxidized in a high pressure oxidation environment to grow the necessary field oxide.

Thereafter, a grown screen oxide layer having a thickness of about 250 Å is formed on the surface of the substrate and a mask is formed, exposing only the sink region 17. A sink implant is performed using an implant energy of about 100 to 190 keV with a dose of between about $1 \times 10^{14}$ and $1 \times 10^{16}$ using phosphorus as a dopant. The resulting dopant concentration in the sink region 17 is between about $1 \times 10^{19}$ and $1 \times 10^{20}/cm^3$. The sink mask is then removed and a separate mask/ion implantation is performed to dope the well and channel regions of the PMOS transistor to a concentration of between about $2 \times 10^{16}$ and $5 \times 10^{16}/cm^3$ using phosphorus as a dopant. In preferred embodiments the implant energy used for the PMOS well region is between about 50 and 150 keV with energy of between about 50 and 10 keV preferred. The resulting net dopant concentration in the channel region of the n-well is between about $2 \times 10^{16}$ and $5 \times 10^{16}/cm^3$. The sink and n-well are then annealed and driven-in by heating with a conventional thermal cycle in nitrogen.

Figure 2B:
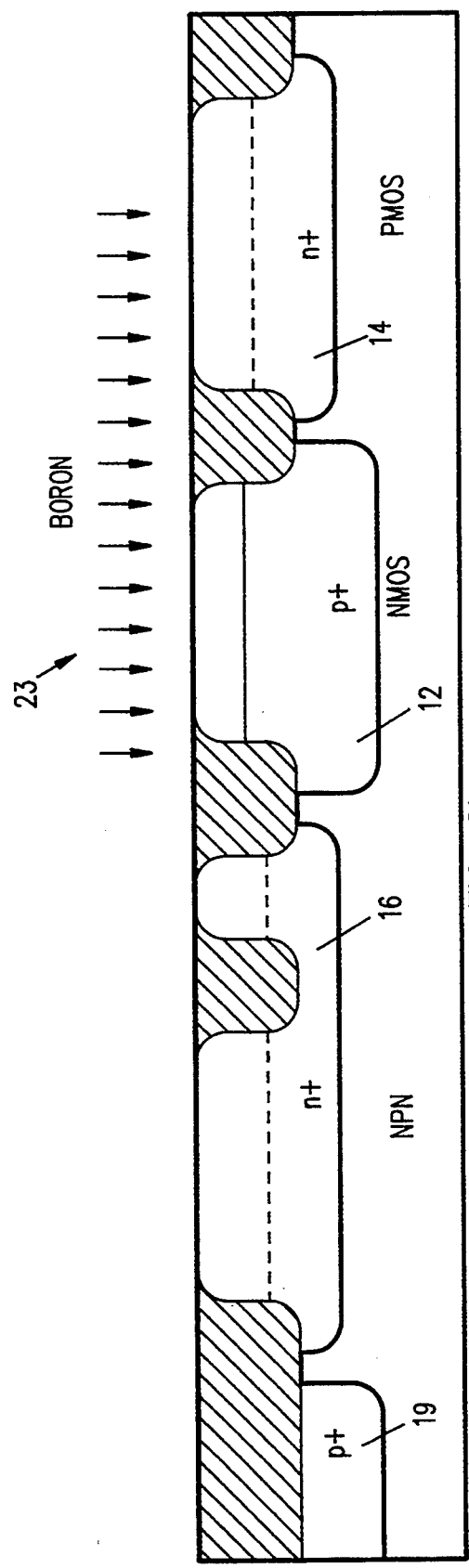
Figure 2G:
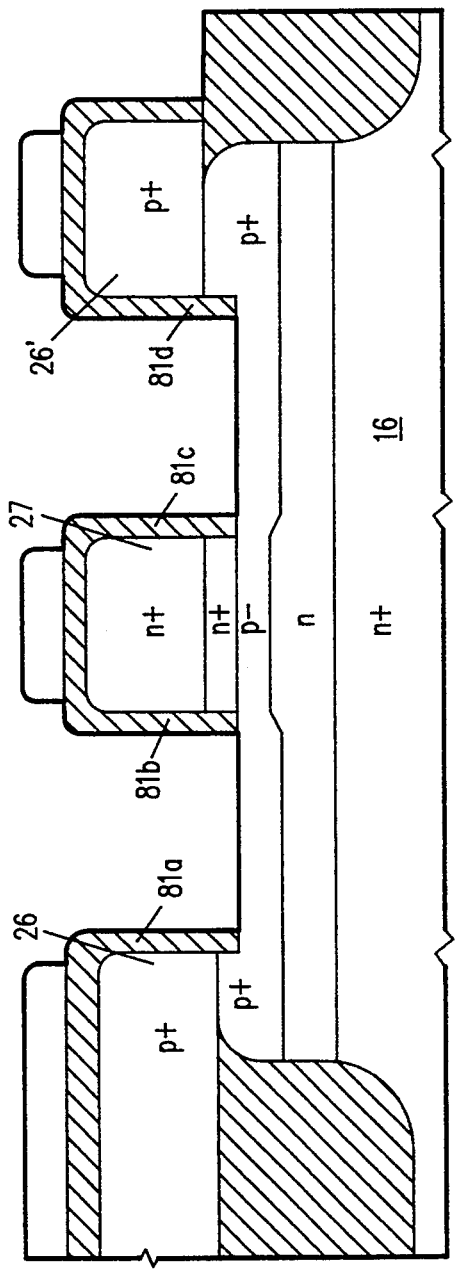

Thereafter, a mask is formed on the surface of the substrate which exposes only the NMOS and PMOS transistor regions. This mask is used for a threshold voltage implant 23 as shown in FIG. 2b. The implant is used to adjust the threshold voltage of the NMOS and PMOS transistors as necessary, typically to between about 0.6 and 1.0. In preferred embodiments the threshold voltage implant is an implant of boron at a dose of between about $1 \times 10^{13}$ to $5 \times 10^{13}$ and preferably at 50 KeV. The threshold voltage implant sets the threshold of the NMOS transistors, while the boron and the up-diffusing p+ from the p-well set the threshold voltage for the NMOS transistor. The threshold voltage implant in conjunction with the n-well implant sets the PMOS threshold voltage. In preferred embodiments the threshold voltage implant ultimately provides transistors with threshold voltages of 0.75±0.1 volts for NMOS and −0.85±0.1 volts for PMOS transistors.

Referring to FIG. 2c, the screen oxide then is stripped and a thin (on the order of 135 to 165 Å) gate oxide layer 59 is grown using means well known to those of skill in the art. A thin (on the order of 400 to 600 Å) layer of polysilicon 60 is then deposited on the thin gate oxide layer and a mask 62 is formed on the poly layer to define the NMOS and PMOS gates. A plasma etch removes the undesired poly from all regions of the substrate except those over the NMOS and PMOS gates. Next, a wet etch is used to remove the underlying oxide. Protection of the gate oxide by the thin poly layer provides MOS gates having far fewer defects since they are not exposed directly to photoresist.

FIG. 2d illustrates the next sequence of process steps. Another layer of intrinsic polysilicon 64 having a thickness of about 1,000 to 4,000 and preferably about 3,200 Å is deposited across the surface of the substrate and a cap oxide layer 66 is formed by thermal oxidation of the polysilicon layer 64. The devices are then masked with photoresist to expose at least the base region of the bipolar transistor and the lightly doped regions of the resistors. In some embodiments, only the NMOS and PMOS transistor regions are protected by the mask. A base implant is then performed and the base is annealed. In preferred embodiments the base implant uses an energy of between about 30 and 100 keV, with an implant energy of between about 30 and 50 preferred. The dose of this implant is preferably about $3 \times 10^{13}$ and $8 \times 10^{13}$. In preferred embodiments the anneal is performed by heating the structure to 950° C. for 45 minutes, and results in a p- base region having a thickness of between about 1,000 and 2,000 Å with a dopant concentration of between about $1 \times 10^{18}$ and $1 \times 10^{19}$/cm$^3$, with a dopant concentration of about $5 \times 10^{18}$/cm$^3$ preferred.

Thereafter, as illustrated in FIG. 2e, a mask is formed which exposes regions 70a, 70b, 70c, and 70d which will eventually be a portion of the resistor, the base contacts, the PMOS source/drain contacts, and the well tap contacts. The regions are preferably doped p+ to a concentration of between about $1 \times 10^{19}$ and $1 \times 10^{20}$/cm$^3$ with a dopant concentration of about $6 \times 10^{19}$/cm$^3$ preferred using boron. The p+ mask is removed and another mask is formed on the surface of the device to expose regions 68a, 68b, and 68c which will eventually be used as the bipolar emitter, the bipolar collector contact, the NMOS source/drain contacts, and well tap contacts. The regions 68 are doped n+ using an arsenic implant with an energy of about 100 keV to a concentration of between about $5 \times 10^{19}$ and $1 \times 10^{20}$/cm$^3$. As discussed above, the PMOS gate may be either n+ or p+ and thus may be included in either the n+ or p+ mask.

As shown in FIG. 2f, a layer of nitride 80 having a thickness of between about 1000 and 1200 Å is deposited for the purpose of preventing diffusion of boron into the top of the polysilicon patterns. The polysilicon layer 64 is then annealed at about 900° C. for a time of about 15 minutes.

Next, a mask is formed on the surface of the nitride 80 to define the bipolar and MOS polysilicon contacts and MOS gates. A dry etch with chlorine chemistry removes the nitride and polysilicon in the region between the emitter 27 and the base contact 26. Extrinsic (undoped) oxide 81a, 81b, 81c, 81d is deposited or grown on the exposed sidewalls of the base and emitter 26, 26', 27 followed by an extrinsic base oxide etch using an anisotropic plasma etch chemistry, to produce the structure shown in FIG. 2g.

Figure 2H:
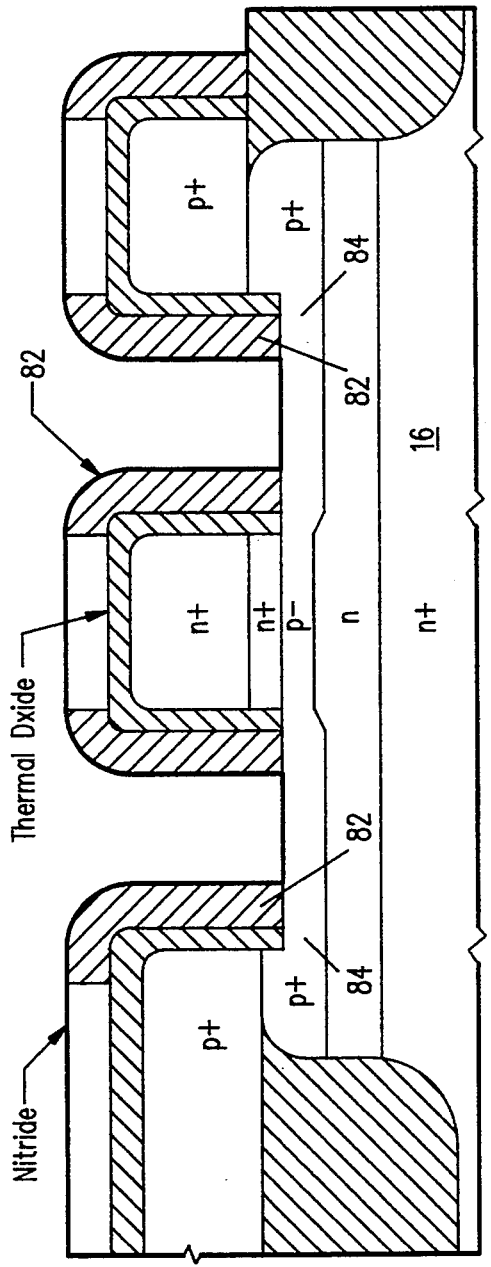
Figure 2I:
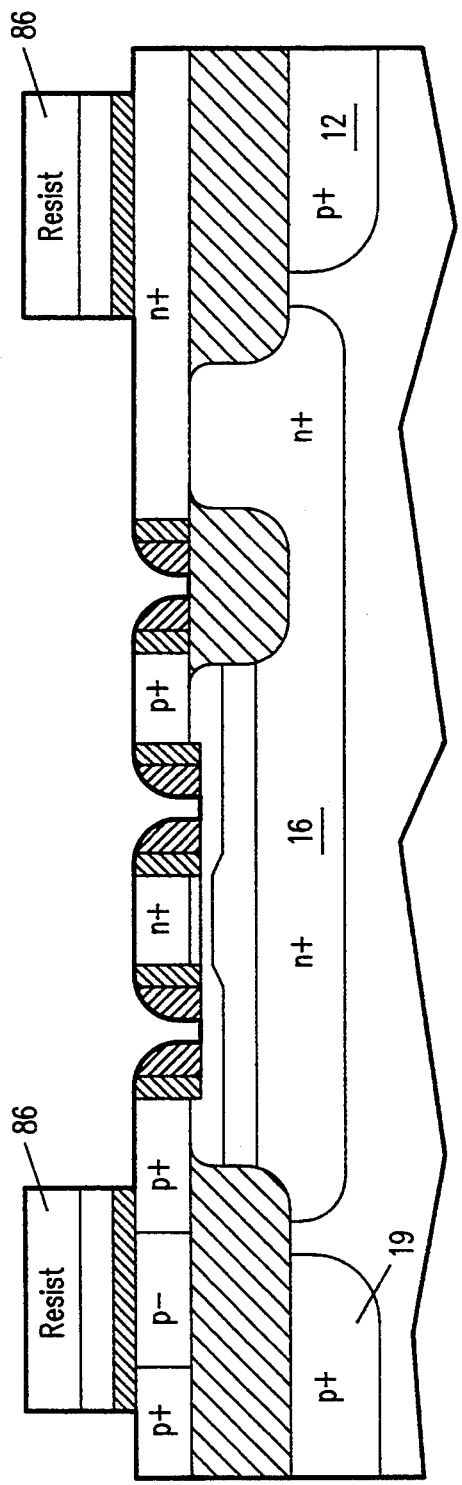
Figure 2J:
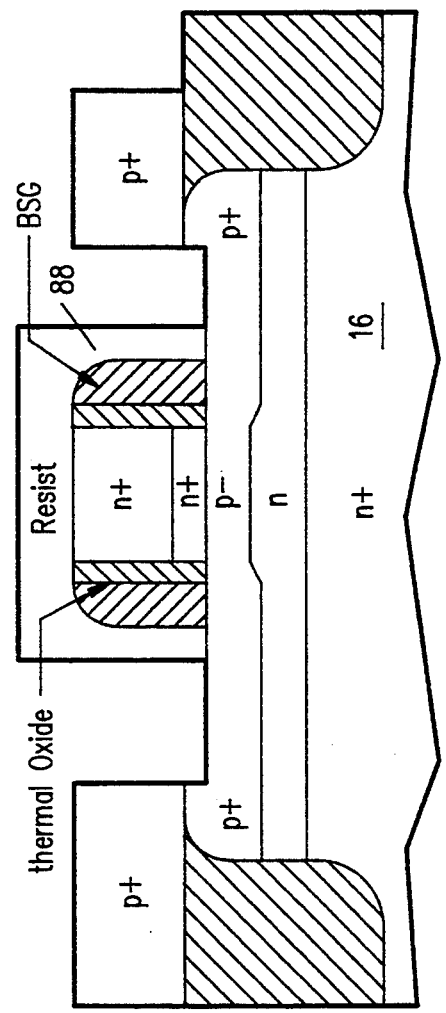

Next, a layer of borosilicate glass (BSG) is deposited on the emitter and base sidewalls as depicted in FIG. 2h. When BSG is to be deposited on the PMOS gate sidewall, such deposition is preferably conducted simultaneously with the bipolar device sidewall BSG deposition. The BSG spacer 82 preferably has a thickness of about 1000–2000 Å. Deposition of BSG spacers 82 can be performed by any of a number of well known sidewall deposition techniques, including chemical vapor deposition followed by a reactive ion etch (RIE). Preferably the BSG layer 82 has a boron content of between about 1 weight percent and 6 weight percent, preferably being about 3 weight percent.

The structure is then subjected to a thermal cycle by heating the structure to about 900° C. for a time of about 30 minutes. The thermal cycle causes migration of boron from the BSG layer into the region immediately below the BSG to form a p+ junction 84 under the BSG, producing the structure depicted in FIG. 2h.

A silicide exclusion mask, 86, is formed on the device over polysilicon regions where silicide formation is not desired (e.g., over the center portion of the resistor). The oxide and nitride layers are then etched to produce the structure depicted in FIG. 2i.

Another mask 88 is then formed over the device for protection of at least the sidewalls spacers on the bipolar emitter and, preferably, the sidewall spacers on the gates of the NMOS and PMOS transistors. The device is etched such as with BOE for about one minute to remove the BSG and oxide from the sidewalls of the exposed polysilicon, producing the structure depicted in FIG. 2j. The resist material 88 is stripped and a final anneal is performed at a temperature of about 1050° C. for a time of about 20 seconds.

Next, a layer of refractory metal 90 such as titanium, molybdenum, tantalum, tungsten, or the like, is deposited across the surface of the device as depicted in FIG. 2k. Using means well known to those of skill in the art, the layer is heated to form metal silicide in regions where the deposited metal is in contact with polysilicon. Remaining unreacted metal is then etched away from the device, leaving the structure as shown in FIG. 2l. Preferably, the silicide reaction is conducted in two steps. The initially deposited titanium is reacted with adjacent polysilicon for a period of time as needed to form an initial amount of silicide that will adhere to the adjacent layers. Unreacted titanium, principally, titanium in contacted with the sidewalls, is removed, for example using $H_2O_2$ and $NH_2O_3$. The device is again heated to cause a second silicide reaction to occur completing the reaction between titanium and adjacent polysilicon and epitaxial silicon. The reaction is conducted in two steps, as described, because reaction of titanium in a single step or pulse may cause undesirable reaction of titanium with the sidewall oxide layers.

Figure 2M:
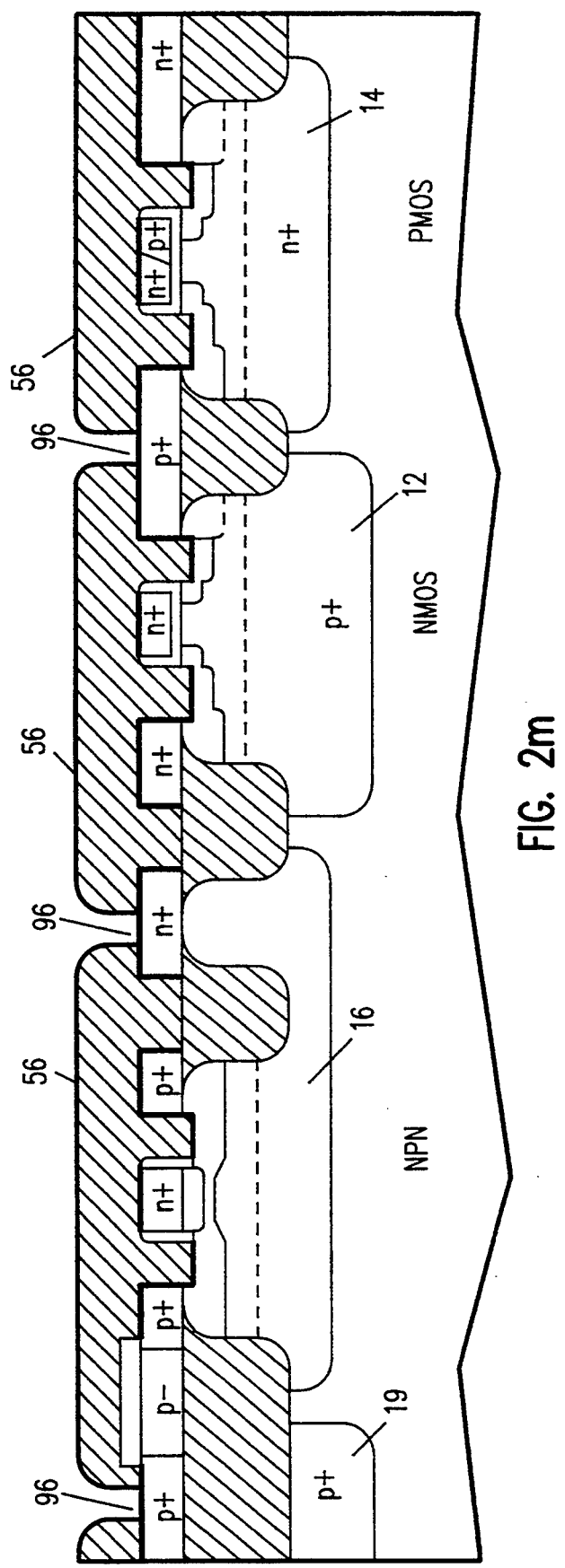
Figure 3A:
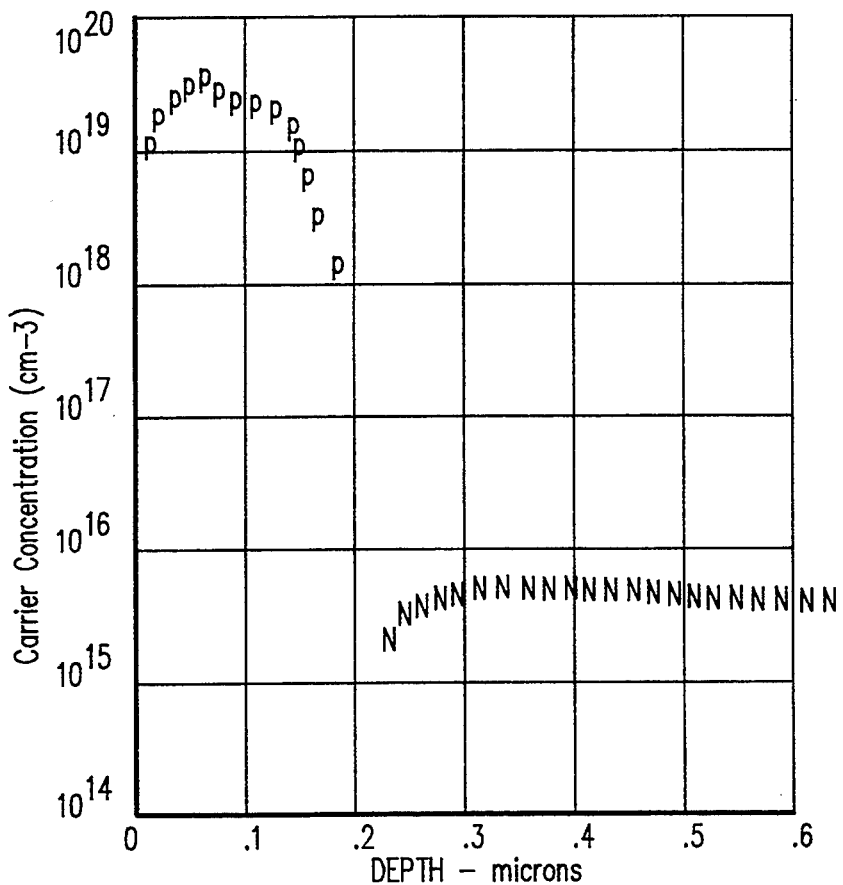
FIGS. 3a to 3f depict dopant profiles for devices made according to the present invention.
Figure 3B:
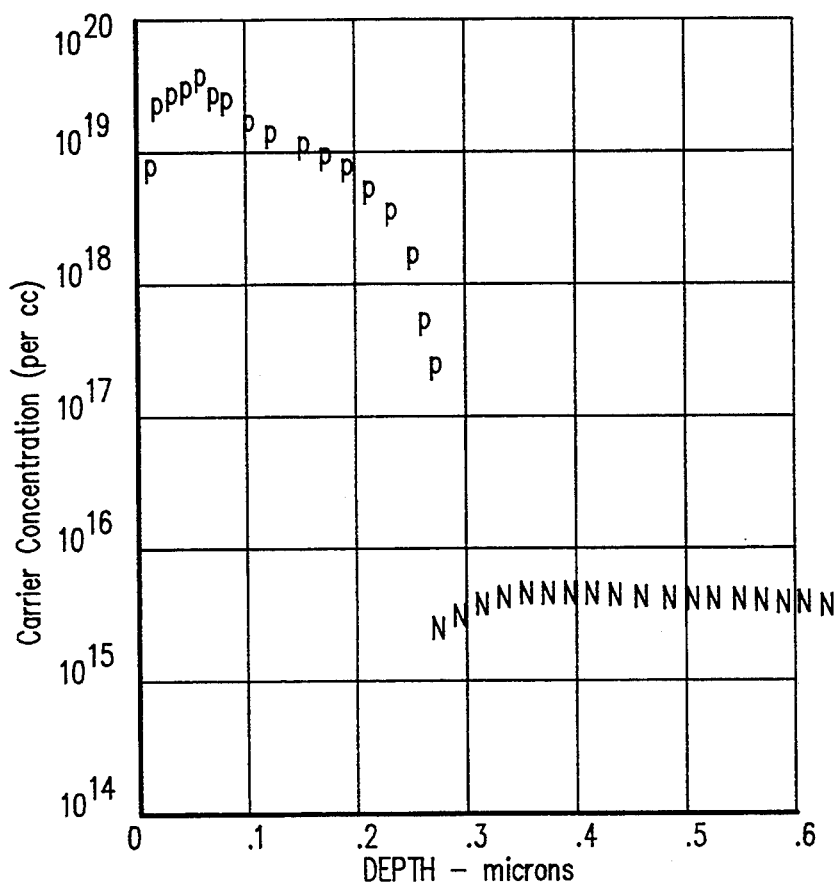
Figure 3C:
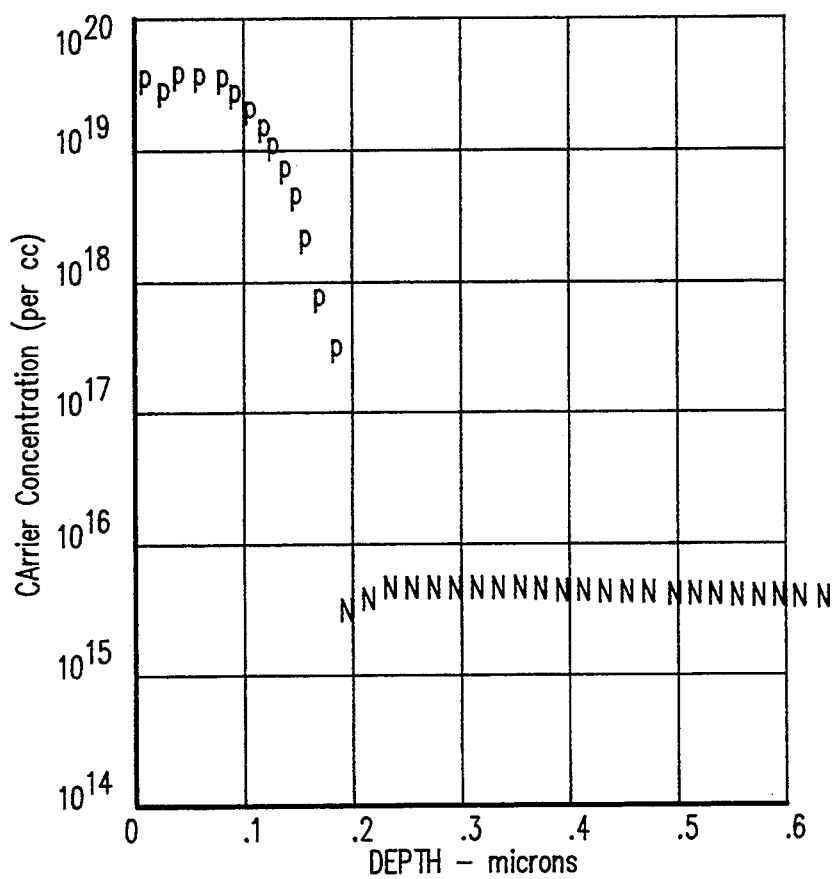
Figure 3D:
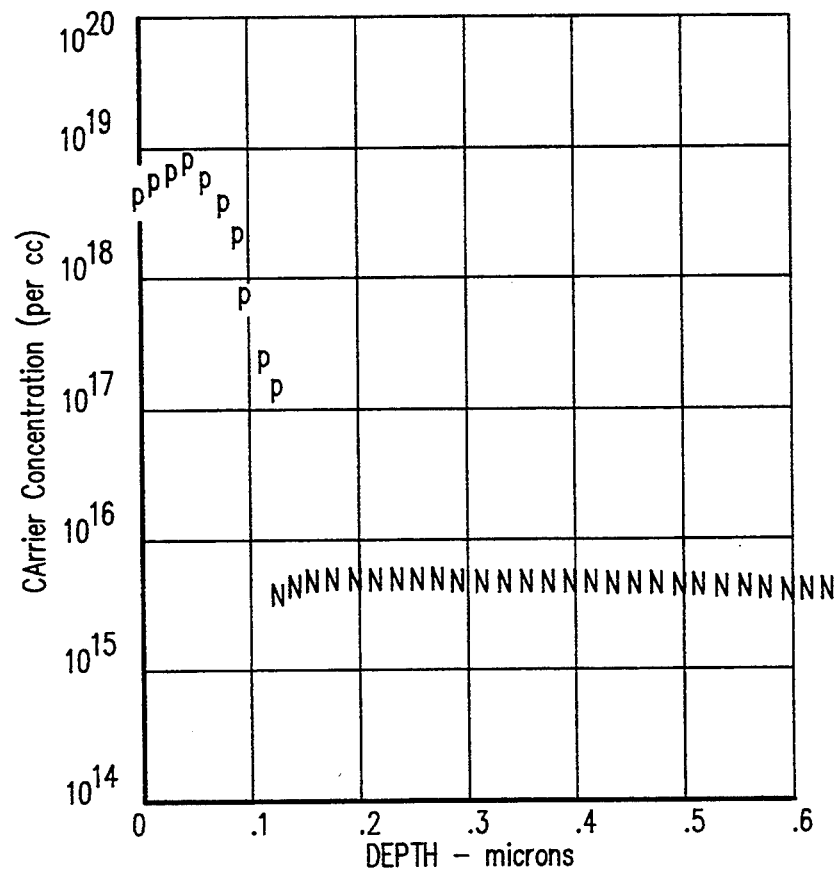
Figure 3E:
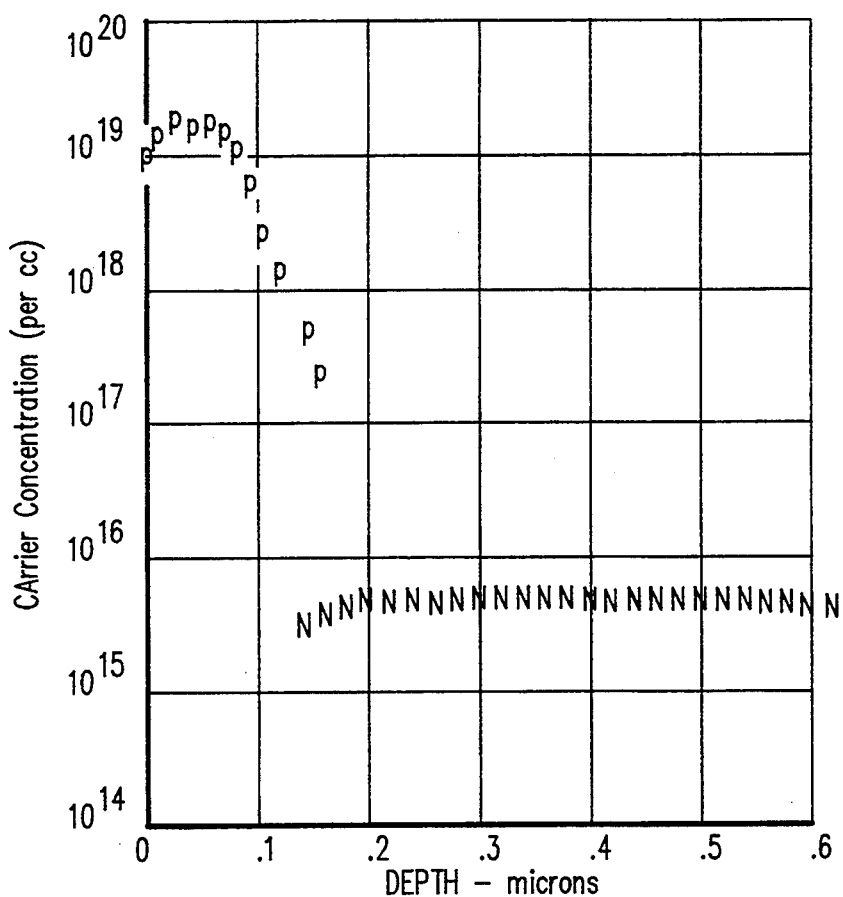
Figure 3F:
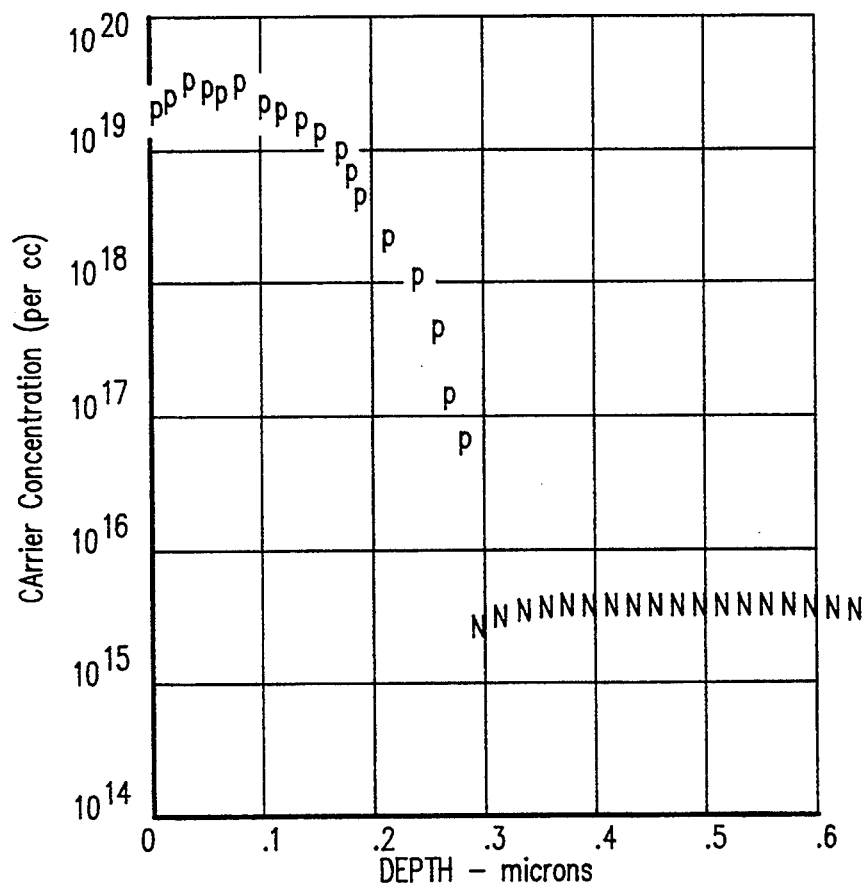

FIG. 2m illustrates the next step in the fabrication sequence in which an oxide layer 56 is deposited and masked to form contact holes 96 therein. Metal is deposited on the surface of the device, masked, and etched from selected regions, providing the device shown in FIG. 1.

III. Device Performance

Tests were conducted to determine the doping profiles obtained from a BSG source after various thermal cycles. Table 1 indicates the processing conducted for various tests which were conducted. Table 1 includes the film thickness, the type of anneal conducted, whether a second anneal was conducted, whether the oxide was stripped between the first and second anneals (in order to determine the profile under the silicided extrinsic base region), the sheet RHO after each anneal, and, for some samples, a junction depth. By splitting the final anneal cycle into two steps, one before and one after the BSG deposition, the depth of the extrinsic base diffusion can be adjusted to the desired value. In order to more closely simulate the final anneal cycle as contemplated in actual production processes, anneal type 1 was conducted without a wet oxidation step. It is believed that conducting anneal type 1 twice, as indicated for some samples in the Table, is approximately equivalent to a final oxidation anneal cycle as contemplated for production of a device.

Six of the samples shown in Table 1 were analyzed to determine dopant profiles and the results are depicted in FIGS. 4a through 4f as indicated in the last column of Table 1. For all cases except that depicted in FIG. 4d, the surface concentration is above $1 \times 10^{19}$ which is much higher than the $1 \times 10^{18}$ which is simulated for processes currently used. Those samples which have the oxide removed between anneal 1 and 2 will tend to have a surface concentration under the spacer which is much higher than without such removal. The sample depicted in FIG. 4b has a surface concentration below the peak, even though the BSG was not removed between the thermal cycles, indicating that the boron concentration in the film was being depleted near the oxide/silicon interface. The sample depicted in FIG. 4f, which has a relatively thick BSG film does not show this effect. The boron concentration in the BSG as deposited was measured to be between 5% and 6%.

Figure 4:
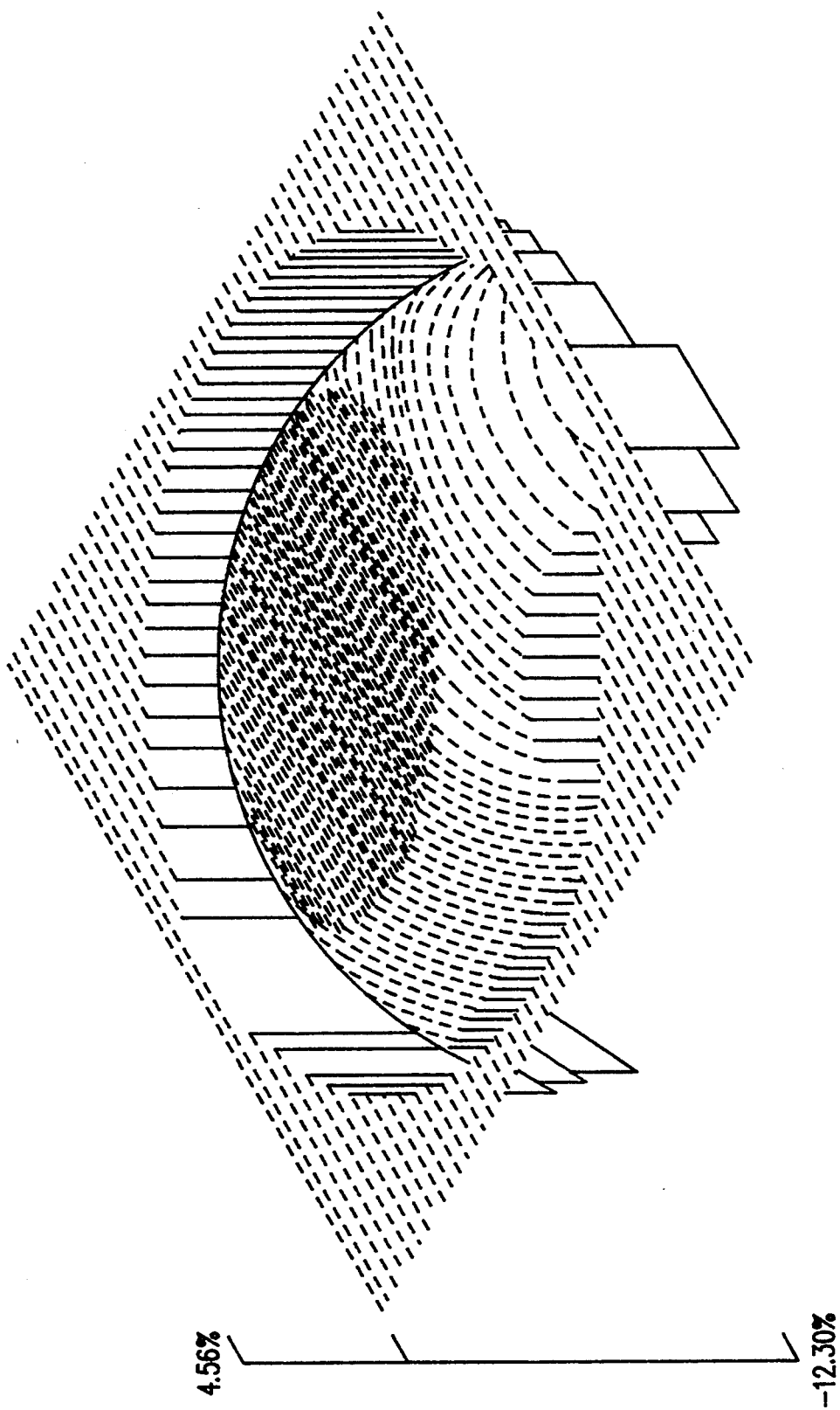
FIG. 4 is a 3-dimensional perspective plot of oxide thickness for a typical wafer formed according to the present invention.

FIG. 4 is a map of oxide thickness for a typical sample. FIG. 4 shows a contour plot of the percent deviation from the mean thickness of 3413.3 Å. The standard deviation for the test was 151.13 Å. The minimum value was 2993.6 Å. The maximum value was 3569.1 Å. The wafer diameter was 100 mm. and the test diameter was 91.44 mm.

Figure 5:
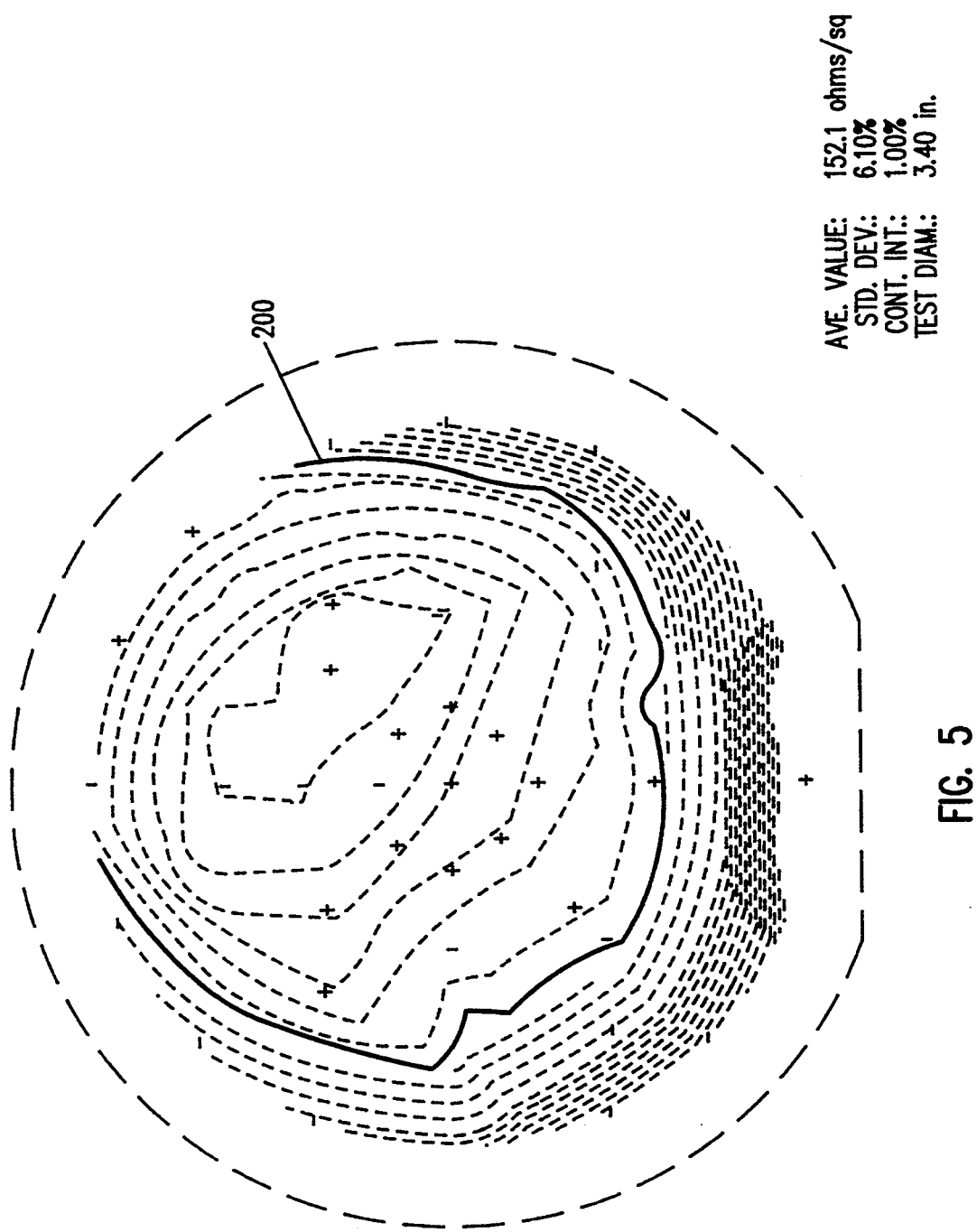
FIG. 5 is a contour plot of sheet resistance for a wafer as shown in FIG. 4.

FIG. 5 is a contour plot of sheet resistance, corresponding to FIG. 4. The heavy line 200 in FIG. 5 shows the contour of the average value which was 152.1 ohm per sq. micron. The remaining contour lines show percent deviation from this average value, with a contour interval of 1%. Values exterior to the average value contour 200 show regions which exceed the average value and those interior to the average line 200 show regions which are less than the average value.

Although the variation in sheet resistance is quite large, the majority of the variation occurs at the periphery of the wafer, and corresponds to thickness variations in the BSG film. The dependance of the sheet resistance on the BSG film thickness can also be seen by observing that the samples with the thicker oxide in Table 1 have a lower sheet resistance for the same thermal processing.

As seen from the above, diffusion from a BSG source can provide low resistance (200 to 300 ohms. per sq. micron) with junction depths in the desired range (0.15 to 0.3 microns) and surface concentrations in excess of $1 \times 10^{19}$.

TABLE 1

BSG DIFFUSION MATRIX RESULTS

| WAFER | FILM THICK ANG. | STD. DEV % | TYPE OF 1ST ANNEAL | OXIDE STRIP BETWEEN 1ST/2ND ANNEAL | SHEET RHO OHM/SQ. | STD. DEV % |
|---|---|---|---|---|---|---|
| 1 | 1911 | 5.9 | 1 | Y | 254 | 7.2 |
| 2 | 1911 | 5.9 | 1 | N | 254 | 7.2 |
| 3 | 1895 | 5.9 | 1 | Y | 263 | 12.9 |
| 4 | 1895 | 5.9 | 1 | N | 263 | 12.9 |
| 5 | 1891 | 6.2 | 1 | Y | 256 | 15.1 |
| 6 | 1891 | 6.2 | 1 | N | 256 | 15.1 |
| 7 | 1917 | 5.1 | 2 | Y | 654 | 9.7 |
| 8 | 1917 | 5.1 | 2 | N | 654 | 9.7 |
| 9 | 1907 | 5.1 | 3 | Y | 301 | 9.1 |
| 10 | 1897 | 5.0 | 3 | N | 301 | 9.1 |
| 11 | 3414 | 4.4 | 1 | Y | 147 | 5.8 |
| 12 | 3414 | 4.4 | 1 | N | 147 | 5.8 |
| 13 | 3413 | 4.4 | 1 | Y | 149 | 6.4 |
| 14 | 3413 | 4.4 | 1 | N | 149 | 6.4 |
| 15 | 3370 | 4.1 | 1 | N | — | — |
| 16 | 3405 | 5.1 | 2 | Y | 266 | 11.6 |
| 17 | 3405 | 5.1 | 2 | N | 266 | 11.6 |
| 18 | 3394 | 5.7 | 3 | Y | 327 | 11.8 |
| 19 | 3394 | 5.7 | 3 | N | 327 | 11.8 |

| WAFER | TYPE OF 2ND ANNEAL | SHEET RHO OHM/SQ. | STD. DEV % | JUNCTION DEPTH ANG. | FIG. DEPICTING DOPANT PROFILES |
|---|---|---|---|---|---|
| 1 | 1 | 287 | *11.5 | 2350 | 3a |
| 2 | 1 | 217 | *9.8 | 2760 | 3b |
| 3 | None | 259 | *4.2 | 1920 | 3c |
| 4 | 2 | 230 | 8.8 | 2100 | — |
| 5 | 2 | 249 | 4.7 | 1900 | — |
| 6 | 2 | 211 | 9.7 | — | — |
| 7 | 1 | 731 | 11.4 | 1250 | 3d |
| 8 | 1 | 280 | *7.0 | — | — |
| 9 | 1 | 350 | *7.8 | 1470 | 3e |
| 10 | 1 | 115 | 9.2 | — | — |
| 11 | 1 | 164 | 5.9 | 2880 | 3f |
| 12 | 1 | 103 | 8.0 | 3450 | — |
| 13 | None | 152 | 6.1 | 2200 | — |
| 14 | 2 | 124 | 8.5 | 2500 | — |
| 15 | 2 | 134 | 8.4 | — | — |
| 16 | 1 | 321 | *12.6 | — | — |
| 17 | 1 | 151 | 6.4 | — | — |
| 18 | 1 | 393 | *11.2 | — | — |

TABLE 1-continued

BSG DIFFUSION MATRIX RESULTS

| 19 | 1 | 114 | *10.0 | — | — |
|----|---|-----|-------|---|---|

*THESE SHEET RESISTANCES WERE MEASURED AT ONLY 9 POINTS RATHER THAN 45 POINTS LIKE THE REST OF THE WAFERS, SO THE STANDARD DEVIATION MAY NOT BE ACCURATE.
ANNEAL TYPE 1 = 10 min., $N_2$ atmosphere, 920° C. + 10 min., dry $O_2$ atmosphere, 920° C. + 10 min., $N_2$ atmosphere, 920° C.
ANNEAL TYPE 2 = Rapid Thermal Anneal at 1000° C., 30 seconds
ANNEAL TYPE 3 = Rapid Thermal Anneal at 1050° C., 30 seconds In view of the above description, a number of advantages to the present invention are apparent. Since the spacer is formed by borosilicate glass, it acts as a constant source of diffusion during subsequent heat treatments, maintaining the surface at or near to the solid solubility limits. Surface concentrations one to two orders of magnitude higher than those obtained with conventional processes have been obtained. Since the BSG deposition is conformal, there are no shadowing effects. In addition, the amount of encroachment by the p+ region into the intrinsic transistor region can be precisely controlled by the thickness of the undoped oxide spacer and the subsequent thermal cycles. Since the surface concentration is high, the p+ doped region is very low in resistivity. The junction depth is controlled only by the thermal budget after the BSG deposition and can result in very shallow junction depths, especially if rapid thermal processing is employed. Thus, low resistance, shallow, p+ doped junctions are formed.

It is to be understood that the above description is intended to be illustrative and not restrictive. Many variations of the invention will become apparent to those of skill in the art upon review of this disclosure. Merely by way of example, particular regions of the devices shown herein have been illustrated as being p-type or n-type, but it will be apparent to those of skill in the art that the role of n- and p-type dopants may readily be reversed for many purposes. Further, while the invention has been illustrated with regard to specific dopant concentrations in some instances, it should also be clear that a wide range of dopant concentrations may be used for many features of the devices herein without departing from the scope of the inventions herein. Still further, while the inventions herein have been illustrated primarily in relation to a BiCMOS device, many facets of the invention could be applied in the fabrication of bipolar transistors, MOSFETs, or other devices in isolation. The scope of the invention should, therefore, be determined not with reference to the above description, but instead should be determined with reference to the appended claims along with their full scope of equivalents.

What is claimed is:

1. A method for forming an extrinsic base region in a bipolar transistor comprising:
   forming an intrinsic base region in a substrate;
   providing a plurality of polysilicon regions on the surface of the substrate, each polysilicon region having at least a first sidewall portion, wherein one of the polysilicon regions comprises an emitter contact disposed over the intrinsic base region and another one of the polysilicon regions comprises a base contact spaced apart from the emitter contact;
   doping the base contact to the same conductivity type as the intrinsic base region;
   depositing a borosilicate glass layer on at least said emitter contact;
   etching selected portions of said borosilicate glass layer to provide a borosilicate glass sidewall spacer adjacent a sidewall of said emitter contact facing a sidewall of said base contact, wherein a gap exists between said sidewall spacer and said sidewall of said base contact;
   annealing said substrate, polysilicon base contact and sidewall spacer following said steps of depositing and etching to cause diffusion of dopants from said borosilicate glass spacer and said polysilicon base contact for forming said extrinsic base without a link implant, wherein substantially all diffusion of said dopants from said borosilicate glass spacer takes place after said step of etching.

2. A method, as claimed in claim 1, further comprising selectively doping portions of said substrate to form emitter and collector regions of said bipolar transistor, wherein said emitter region is formed by out-diffusion of dopants from the emitter contact.

3. The method according to claim 1 wherein said borosilicate glass layer depositing step comprises the step of depositing a borosilicate glass layer on at least said emitter contact and said base contact, and wherein said etching step comprises etching selected portions of said borosilicate glass layer to provide a first borosilicate glass sidewall spacer adjacent a sidewall of said emitter contact and a second borosilicate glass sidewall spacer adjacent a sidewall of said base contact, wherein the first sidewall spacer faces the second sidewall spacer, and wherein a gap exists between said first sidewall spacer and said second sidewall spacer.

4. The method according to claim 3 wherein said annealing step comprises annealing said substrate, polysilicon base contact, and first and second spacers following said steps of depositing and etching to cause diffusion of dopants from said first and second spacers and said polysilicon base contact for forming said extrinsic base without a link implant, wherein substantially all diffusion of said dopants from said borosilicate glass spacer takes place after said step of etching.

5. The method according to claim 1 wherein said extrinsic base region beneath said sidewall spacer has a sheet resistance less than about 300 ohms per square and has a junction depth less than about 0.3 microns.

6. The method according to claim 1 further comprising the steps of, prior to the borosilicate glass layer depositing step:
   depositing an undoped insulating layer on at least said emitter contact; and
   etching said insulating layer for forming an insulating sidewall spacer on a sidewall of said emitter contact facing a sidewall of said base contact.

* * * * *